US006852926B2

(12) United States Patent
Ma et al.

(10) Patent No.: US 6,852,926 B2
(45) Date of Patent: Feb. 8, 2005

(54) PACKAGING MICROELECTROMECHANICAL STRUCTURES

(75) Inventors: Qing Ma, San Jose, CA (US); Valluri Rao, Saratogo, CA (US); John Heck, Mountainview, CA (US); Daniel Wong, Fremont, CA (US); Michele Berry, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/106,728

(22) Filed: Mar. 26, 2002

(65) Prior Publication Data

US 2003/0183407 A1 Oct. 2, 2003

(51) Int. Cl.[7] ................................................ H05K 5/06
(52) U.S. Cl. ........................ 174/52.2; 257/704; 438/456
(58) Field of Search ............................. 174/52.2, 52.4; 257/704, 787; 438/106, 411, 421, 422, 458

(56) References Cited

U.S. PATENT DOCUMENTS

| 5,610,431 | A | | 3/1997 | Martin | |
|---|---|---|---|---|---|
| 6,219,254 | B1 | | 4/2001 | Akerling et al. | |
| 6,297,072 | B1 | * | 10/2001 | Tilmans et al. | 438/106 |
| 6,528,344 | B2 | * | 3/2003 | Kang | 438/106 |
| 6,550,664 | B2 | * | 4/2003 | Bradley et al. | 228/179.1 |
| 6,596,117 | B2 | * | 7/2003 | Hays et al. | 156/251 |
| 6,624,003 | B1 | * | 9/2003 | Rice | 438/106 |
| 2002/0000646 | A1 | | 1/2002 | Gooch et al. | |

FOREIGN PATENT DOCUMENTS

WO    WO 98/06118    2/1998

OTHER PUBLICATIONS

J. Neysmith et al., *A Modular, Direct–Chip–Attach Package: Architecture and Processing*, 2000 International Symposium on Microelectronic, Boston, MA, Sep. 2000, pp. 569–573.
S. Renard, *Wafer level Surface Mountable Chip Size Paging for MEMS and ICs*, Proceedings of the SPIE, Bellingham, VA, vol. 4176, Sep. 2000, pp. 236–291.
H. Tilmans et al., *The Indent Reflow Sealing (IRS) Technique—A Method for the Fabrication of Sealed Cavities for MEMS Devices*, Journal of Microelectromechanical Systems, IEEE, New York, USA, vol. 9, No. 2, Jun. 2000, pp. 206–217.

* cited by examiner

*Primary Examiner*—Dean A. Reichard
*Assistant Examiner*—Carmelo Oliva
(74) *Attorney, Agent, or Firm*—Trop, Pruner & Hu, P.C.

(57) ABSTRACT

A MEMS device may be formed in a hermetic cavity by sealing a pair of semiconductor structures to one another, enclosing the MEMS device. The two structures may be coupled using surface mount techniques as one example, so that the temperatures utilized may be compatible with many MEMS applications. Electrical interconnection layers in one or the other of these structures may be utilized to allow electrical interconnections from the exterior world to the MEMS components within the cavity.

18 Claims, 7 Drawing Sheets

PACKAGING MICROELECTROMECHANICAL STRUCTURES

BACKGROUND

This invention relates generally to microelectromechanical structures (MEMS) and particularly to techniques for packaging MEMS.

In some cases, MEMS components such as varactors, switches and resonators need to be packaged in a hermetic environment. For example, particularly with radio frequency MEMS components, there may be a need for hermetic packaging. Such packaging protects the MEMS components from the outside environment.

Conventionally, two approaches have been utilized for hermetic packaging of MEMS components. Ceramic packages with cavities that may be sealed are used in the defense industry. This approach, while reliable, may be cost prohibitive for many commercial applications.

A second approach is to use a glass frit to bond a wafer containing the MEMS components to a cover. However, this technique requires high temperature bonding that may not be suitable for all components utilized in some MEMS applications. In some cases, the glass frit occupies a large area that increases the size of the resulting product and therefore increases its costs. In some cases, the glass frit bonding technology uses wire bonds for electrical connections that may not be adequate in some applications, such as high frequency applications.

Thus, there is a need for better ways to package MEMS components.

DETAILED DESCRIPTION

Figure 1:
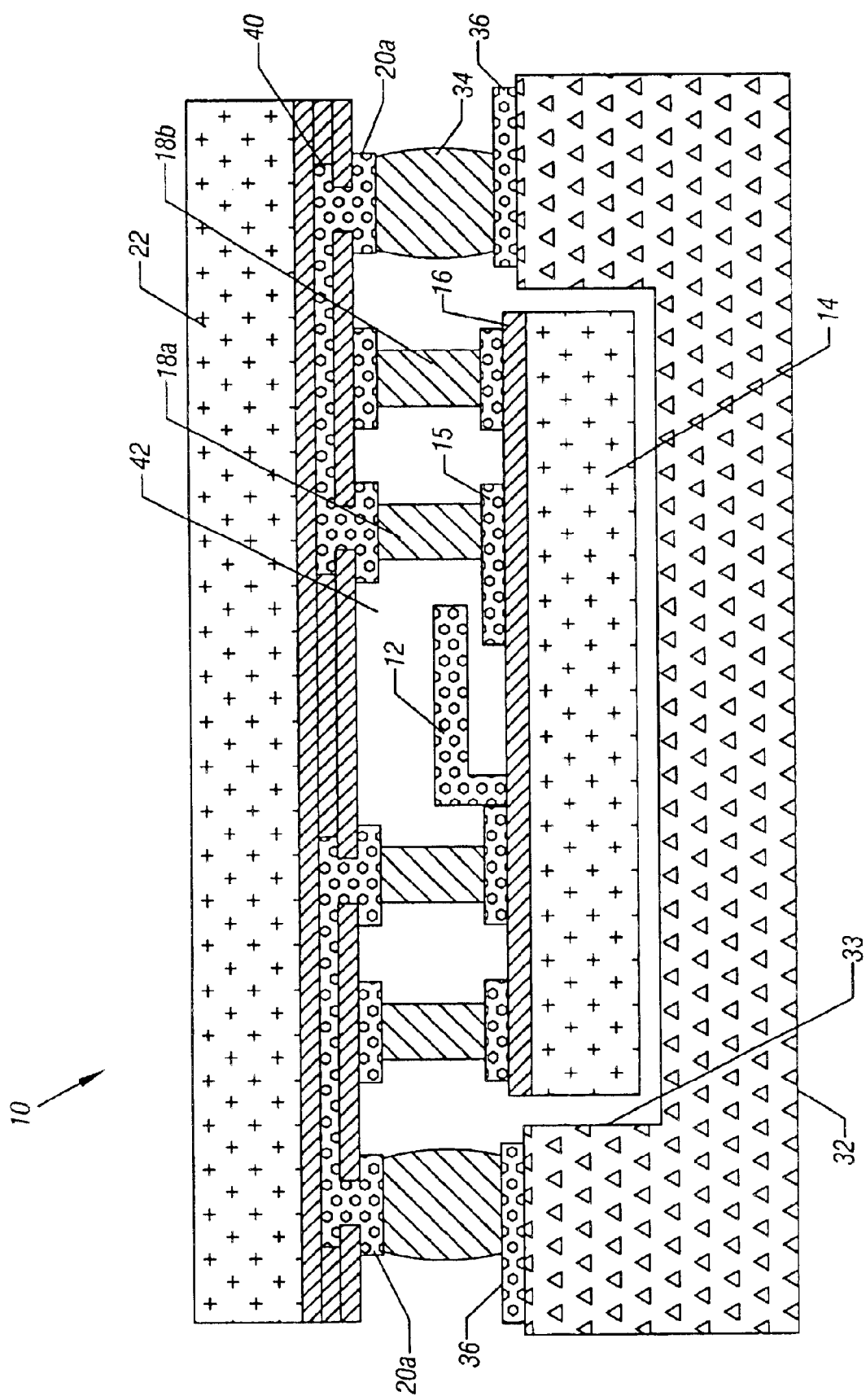
FIG. 1 is an enlarged cross-sectional view of one embodiment of the present invention.

Referring to FIG. 1, a MEMS component 12, such as a radio frequency (RF) MEMS component, including as examples a varactor, a switch or a resonator, may be formed on a semiconductor structure 14 having a layer 16. A plurality of bond pads 15 and 16 may be provided on the layer 16. The MEMS component 12 may be surrounded on one side by a printed circuit board 32 having a cavity 33 conforming to the shape of the semiconductor structure 14 in some embodiments. A gap may be maintained between the board 32 and the structure 14.

A plurality of solder bumps 34 may bond the printed circuit board 32 to a semiconductor structure 22 through bond pads 36 and 20a. The semiconductor structure 22 may have internal electrical interconnection layers 40 that interconnect bond pads 15, 20a and 36 on the structure 14, the board 32 and the semiconductor structure 22. Thus, electrical connections are possible between the various components.

A solder ring 18b completely encircles the MEMS device 12, defining a sealed or hermetic cavity 42 for the device 12, in one embodiment. In another embodiment, the cavity 42 may be at a reduced pressure. The vias 18a provide electrical interconnections between the structure 14 and the structure 22.

Figure 2:
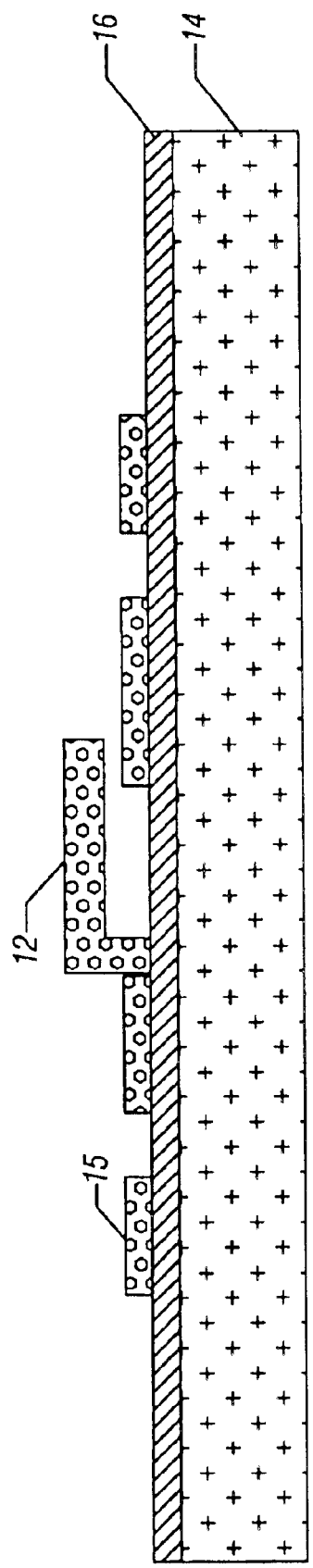
FIG. 2 is an enlarged cross-sectional view of a component of one embodiment of the present invention at an early stage of manufacturing.

In accordance with one embodiment of the present invention, the package 10 may be processed by forming the MEMS device 12 on the structure 14 over a layer 16 as shown in FIG. 2. In addition, a plurality of contacts 15 may be provided as well. The layer 16 may provide electrical connections between the contacts 15 and the MEMS device 12 through the semiconductor structure 14 in some embodiments.

Figure 3:
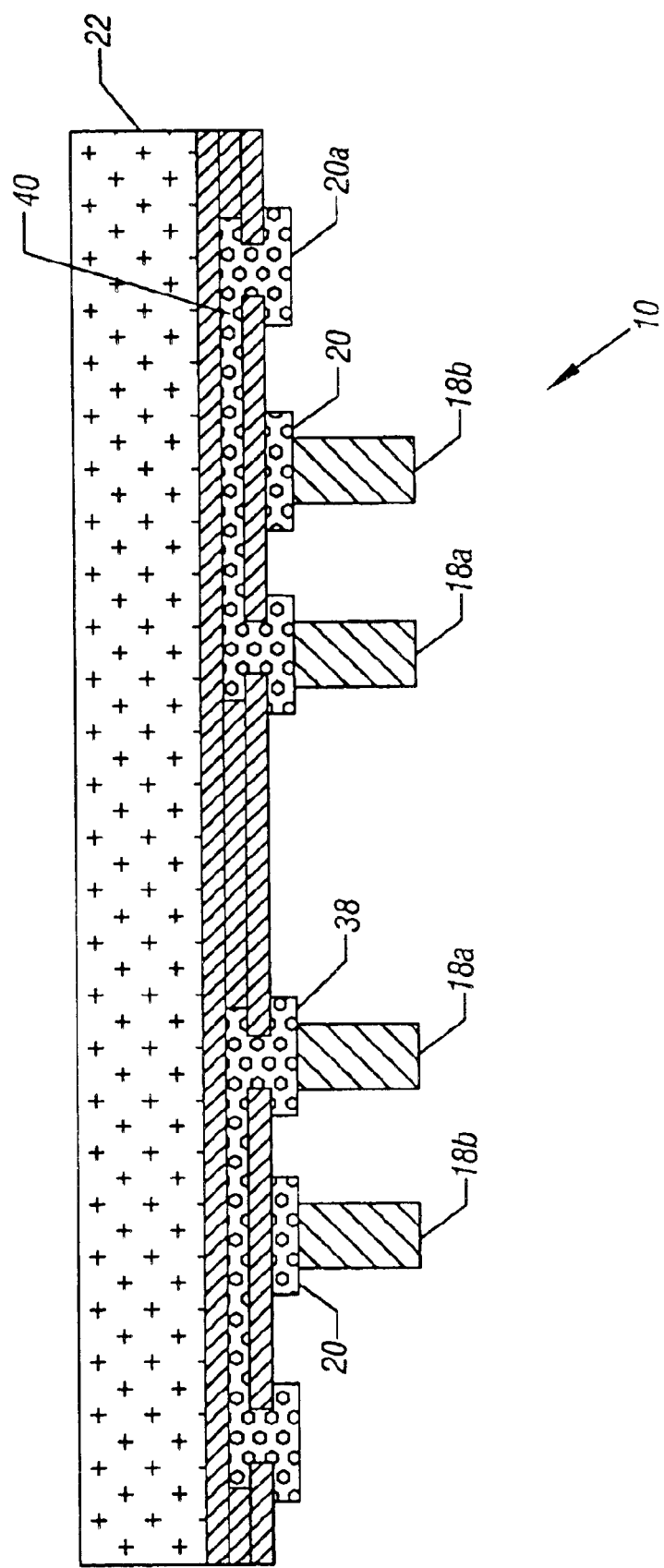
FIG. 3 is an enlarged cross-sectional view of another component of one embodiment of the present invention at an early stage of manufacture.

Referring to FIG. 3, the semiconductor structure 22 may include an internal electrical interconnection layer 40 that electrically couples pads 20a and vias 18a in one embodiment of the present invention. In addition, a sealing ring 18b may be coupled to a pad 20, in accordance with one embodiment of the present invention. The sealing ring 18b is not necessarily for electrical purposes but rather forms a vertical sealing wall between the structures 14 and 22 for hermetically sealing the MEMS device 12 inside the package 10. Electrical interconnections to the outside would be provided by the vias 18a coupled to the contacts 20a, in one embodiment of the present invention. The contacts 20a may be solder or gold bumps and the ring 18b may be made of solder or gold, in some embodiments.

Figure 4:
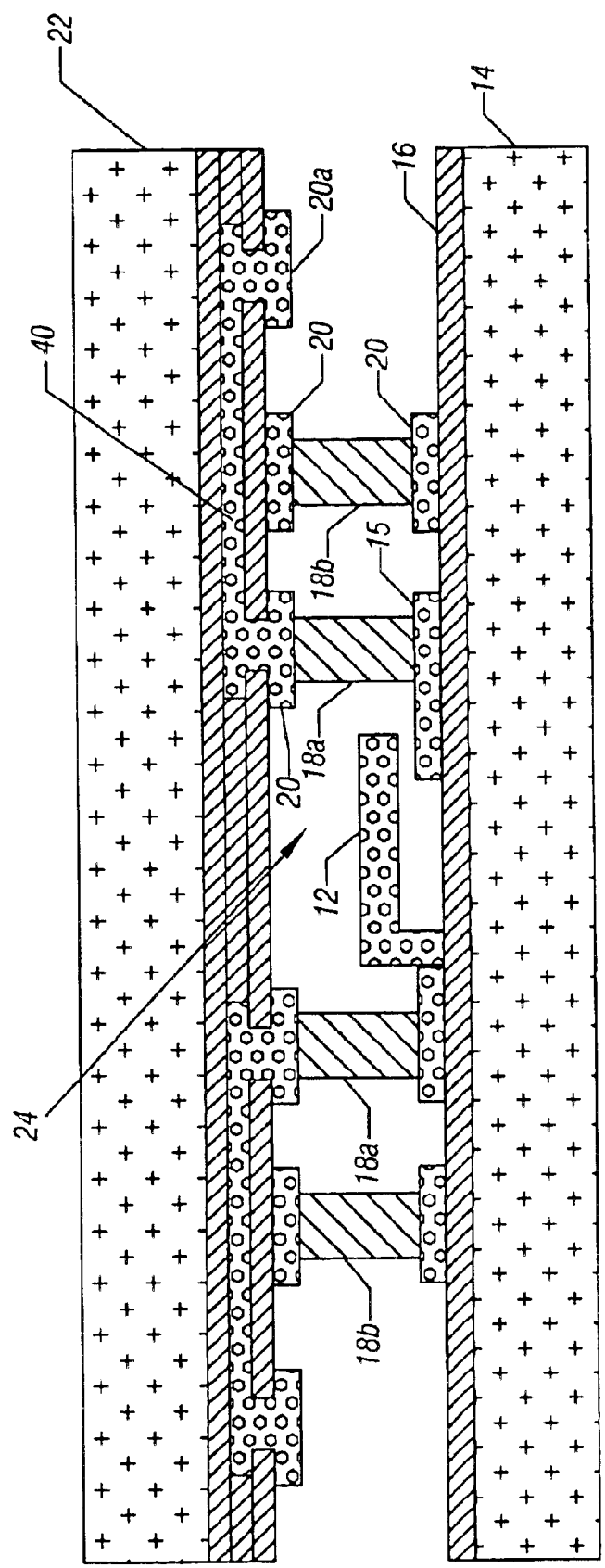
FIG. 4 is an enlarged cross-sectional view of the components shown in FIGS. 2 and 3, having been joined, but still at an early stage of manufacturing.

Referring to FIG. 4, the structures 14 and 22 have been combined with the structure 22 positioned on top of the structure 14. The combined package 10 may be heated to fuse the vias 18 to the pads 15 and the ring 18b to the bond ring 20. In some embodiments, surface mount techniques using temperatures of 300° C. or less may be used.

In one embodiment, a semiconductor wafer including a plurality of structures 14 may be combined with a semiconductor wafer including a plurality of structures 22. In that embodiment each pair of structures 14 and 22 are simultaneously bonded to one another across the wafers.

At this stage, the solder ring 18b makes contact with bond ring 20 on the semiconductor structure 14, forming a hermetic seal around the MEMS device 12 in the cavity 24. In some embodiments, the cavity 24 may be a vacuum cavity.

The electrical vias 18a extend from the structure 22 to the structure 14 making electrical contact with the contacts 15, in one embodiment of the present invention. Thus, electrical connections may be made to and from the MEMS device 12, circumventing the sealing ring 18b via the buried interconnection layer 40 within the structure 22 in one embodiment. For example, as shown in FIG. 4, the ring 18a is surface mounted to a pad 20 in turn coupled to the interconnection layer 40 which finally couples to a pad 20a on the exterior of the sealing ring 18b relative to the MEMS device 12. However the interconnection layer 40 may be provided in either or both of the structures 14 and 22 in other embodiments.

In this way, electrical connections may be made to the MEMS device 12 through the exterior contacts 20a. In addition, the structure shown in FIG. 4 may be made at relatively low temperatures, for example under 300° C. in some embodiments, by using surface mounting techniques for combining the structures 14 and 22.

Figure 5:
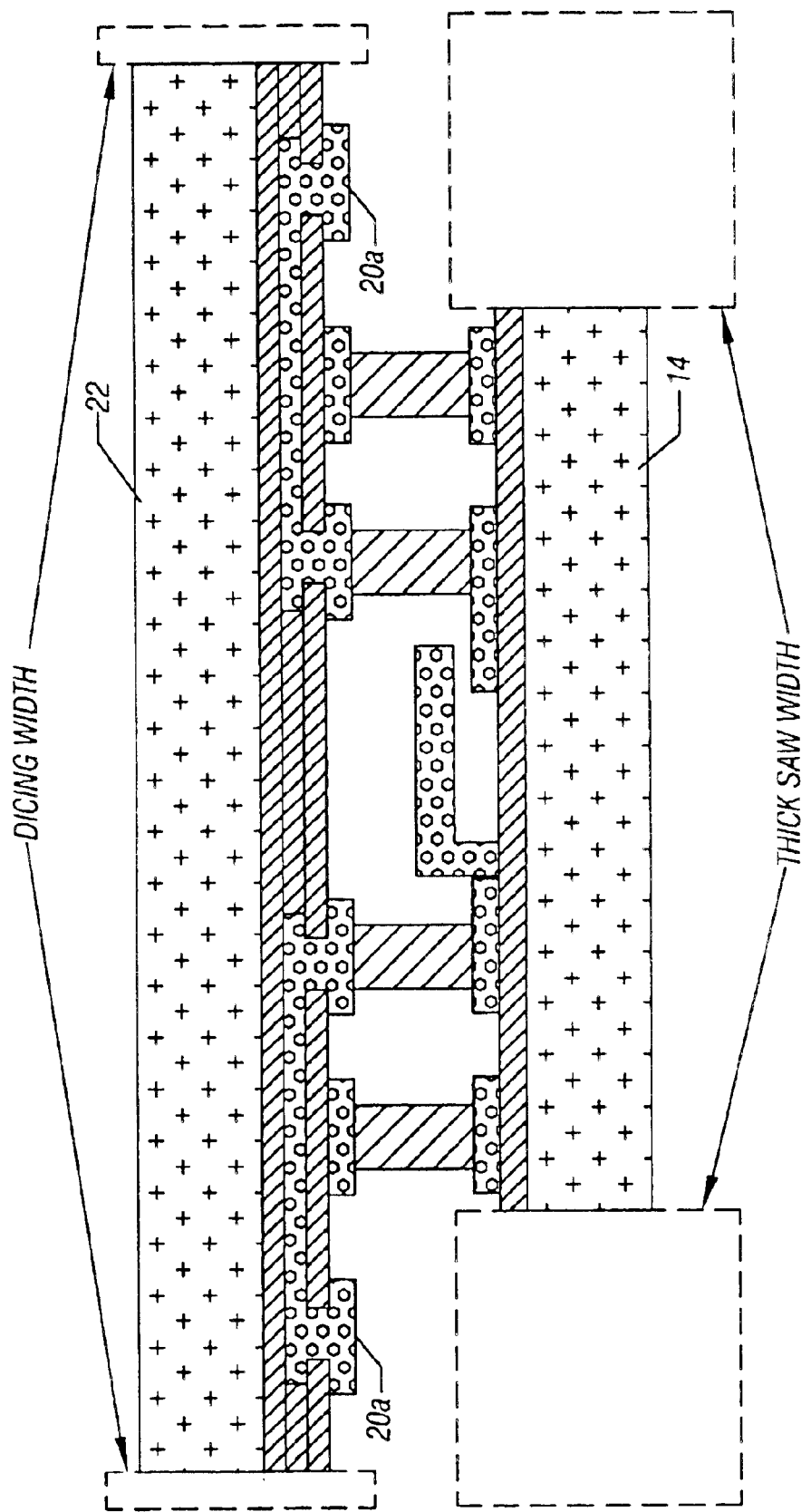
FIG. 5 shows one technique for processing the structure shown in FIG. 4 in accordance with one embodiment of the present invention.

Referring to FIG. 5, in accordance with one embodiment of the present invention, in order to access the contacts 20a, lateral portions of the semiconductor structure 14 may be cut away. In one embodiment, a thick saw, as indicated, may be utilized to saw through the semiconductor structure 14 separating it from its wafer and a dicing saw may be utilized to separate the structure 22 from the rest of its wafer.

Figure 6:
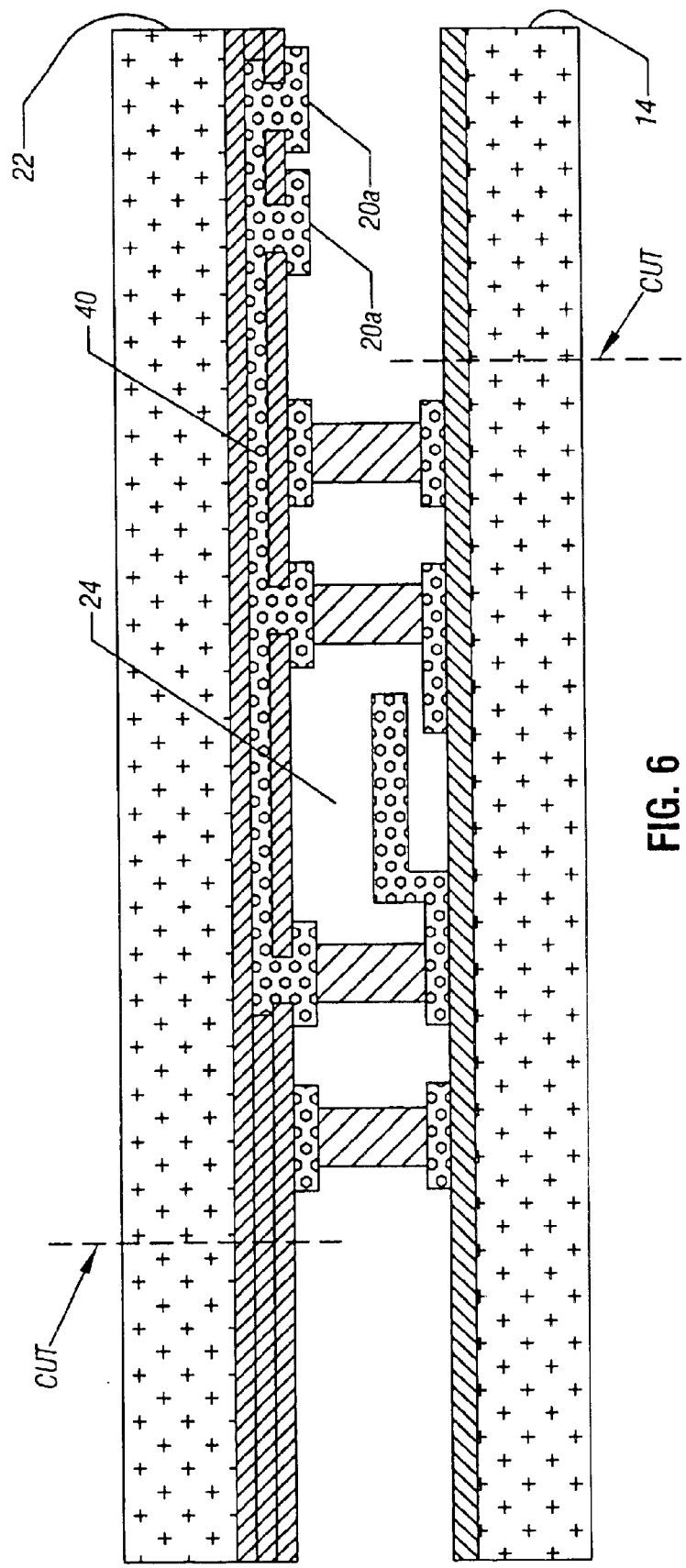
FIG. 6 shows another technique for processing the component shown in FIG. 4 in accordance with one embodiment of the present invention.

In accordance with another embodiment, both of the structures 14 and 22 may be severed along cut lines as indicated in FIG. 6. For example, a cut through the structure 22 may be primarily to sever the structure 22 from the rest of its wafer. The cut through structure 14 reveals bond pads 20a on the structure 22. In this case, a pair of electrical bond pads 20a may be provided, but in another embodiment, any number of contacts 20a may be utilized as necessary.

Again, the interconnection layer 40 acts as a buried contact to allow electrical connections from the MEMS device 12 in the interior of the cavity 24 to the outside world without compromising the sealed nature of the cavity 24.

Figure 7:
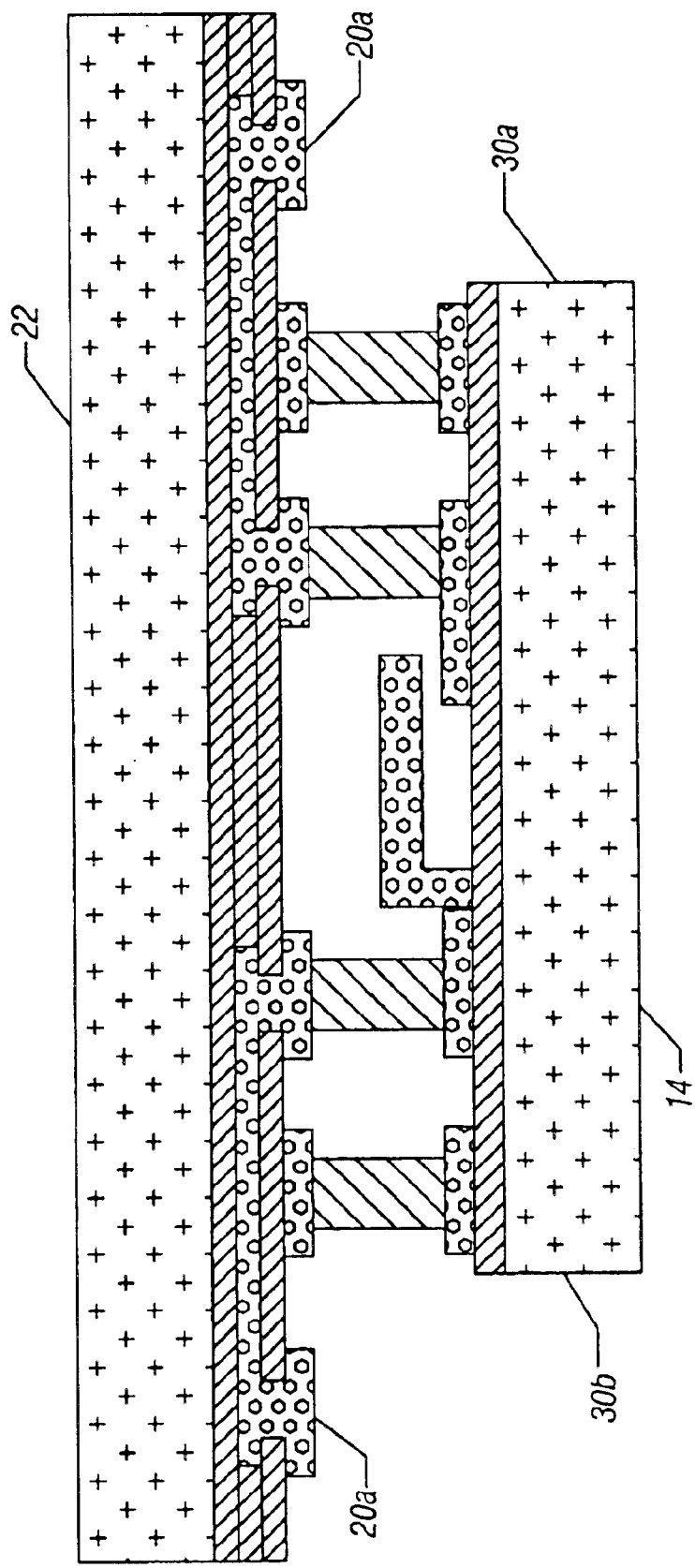
FIG. 7 is an enlarged cross-sectional view of one embodiment after further processing.

After severing, in accordance with any of a variety of techniques including those shown in FIGS. 5 and 6, the resulting structure is shown in FIG. 7, with the pads 20a fully accessible.

Next, as shown in FIG. 1, a printed circuit board 32 may be bonded to the semiconductor structure 22. This may be done using solder bumps 34 and surface mount bonding pads 36 on the printed circuit board 32 to make electrical connection to the interconnection layers 40 through the bond pads 20a. The structure 14 may be left free floating for thermal compatibility or a suitable adhesive or filler may be used between the board 32 and the structure 14.

Again, by using surface mount techniques, the processing temperatures may be reduced. Lower processing temperatures may be important in processing MEMS components in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A packaged microelectromechanical structure device comprising:
    a first semiconductor structure;
    a microelectromechanical structure device formed on the first semiconductor structure;
    a second semiconductor structure;
    a vertical wall extending between said first and second structures around said device to form a hermetic cavity enclosing said device between said first and second structures; and
    a printed circuit board bonded to said second semiconductor structure around said first semiconductor structure.

2. The device of claim 1 wherein said wall is secured to said first and second structures by bonding pads and wherein said wall is formed of a material that is surface mountable.

3. The device of claim 1 including an electrical contact in said cavity to make contact to said microelectromechanical structure device, an interconnection layer extending through one of said first and second structures, and an electrical contact on the exterior of said cavity on one of said first and second structures to enable an electrical connection to be made to said microelectromechanical structure device from the exterior of said cavity.

4. The device of claim 3 wherein said interconnection layer is in said second semiconductor structure.

5. The device of claim 4 including a via that extends from said first semiconductor structure to said second semiconductor structure coupling said contact to said interconnection layer.

6. The device of claim 3 wherein said interconnection layer extends through the interior of said second semiconductor structure.

7. The device of claim 1 wherein said board is surface mounted to said second semiconductor structure.

8. The device of claim 7 wherein the board does not directly connect to said first semiconductor structure.

9. The device of claim 8 wherein said first semiconductor structure is smaller than said second semiconductor structure.

10. A packaged microelectromechanical structure device comprising:
    a first semiconductor structure;
    a microelectromechanical structure device formed on said first semiconductor structure;
    a second semiconductor structure bonded to said first semiconductor structure to farm a hermetic cavity surrounding said device;
    an interconnection layer through one of said first and second semiconductor structures to enable electrical connections from outside said cavity to said device within said cavity; and
    a printed circuit board bonded to said second semiconductor structure around said first semiconductor structure.

11. The device of claim 10 wherein said interconnection layer extends through said second semiconductor structure.

12. The device of claim 10 including a vertical wall extending between said first and second structures to form said hermetic cavity.

13. The device of claim 12 including bonding pads on said first and second structures, said vertical wall contacting said bonding pads.

14. The device of claim 10 wherein said first and second semiconductor structures are surface mounted to one another.

15. The device of claim 10 wherein said board is surface mounted to said second semiconductor structure.

16. The device of claim 15 wherein said board does not directly connect to said first semiconductor structure.

17. The device of claim 16 wherein said first semiconductor structure is smaller than said second semiconductor structure.

18. The device of claim 10 wherein said interconnection layer extends through the interior of said second semiconductor structure.

* * * * *

UNITED STATES PATENT AND TRADEMARK OFFICE
CERTIFICATE OF CORRECTION

PATENT NO. : 6,852,926 B2
DATED : February 8, 2005
INVENTOR(S) : Qing Ma et al.

It is certified that error appears in the above-identified patent and that said Letters Patent is hereby corrected as shown below:

<u>Column 4,</u>
Line 33, "farm" should be -- form --.

Signed and Sealed this

Twenty-fourth Day of May, 2005

JON W. DUDAS
*Director of the United States Patent and Trademark Office*